United States Patent
Cho et al.

(10) Patent No.: US 7,184,509 B2
(45) Date of Patent: Feb. 27, 2007

(54) DELAY LOCKED LOOP CIRCUIT FOR INTERNALLY CORRECTING DUTY CYCLE AND DUTY CYCLE CORRECTION METHOD THEREOF

(75) Inventors: Geun-Hee Cho, Kyungki-do (KR); Kyu-Hyoun Kim, Kyungki-do (KR)

(73) Assignee: Samsung Elctronics Co., Ltd., Suwon-si (KR)

( * ) Notice: Subject to any disclaimer, the term of this patent is extended or adjusted under 35 U.S.C. 154(b) by 764 days.

(21) Appl. No.: 10/619,821

(22) Filed: Jul. 14, 2003

(65) Prior Publication Data

US 2004/0066873 A1 Apr. 8, 2004

(30) Foreign Application Priority Data

Oct. 5, 2002 (KR) ................... 10-2002-0060814

(51) Int. Cl.
H03D 3/24 (2006.01)
H03L 7/06 (2006.01)

(52) U.S. Cl. .................. 375/373; 375/375; 375/376; 327/158

(58) Field of Classification Search .......... 375/371, 375/373, 375, 376, 354; 327/141, 175, 144–149, 327/152–159
See application file for complete search history.

(56) References Cited

U.S. PATENT DOCUMENTS

| | | | |
|---|---|---|---|
| 5,614,855 A | 3/1997 | Lee et al. | |
| 5,883,534 A * | 3/1999 | Kondoh et al. | 327/156 |
| 6,125,157 A | 9/2000 | Donnelly et al. | |
| 6,243,031 B1 * | 6/2001 | Jusuf et al. | 341/68 |
| 6,570,944 B2 * | 5/2003 | Best et al. | 375/355 |
| 6,731,147 B2 * | 5/2004 | Fiscus | 327/158 |
| 7,042,971 B1 * | 5/2006 | Flanagan et al. | 375/376 |
| 2001/0030562 A1 | 10/2001 | Kim, et al. | |
| 2003/0080791 A1 * | 5/2003 | Fiscus | 327/158 |
| 2003/0120456 A1 * | 6/2003 | Watson et al. | 702/177 |
| 2003/0179027 A1 * | 9/2003 | Kizer et al. | 327/158 |

FOREIGN PATENT DOCUMENTS

DE 197 03 986 12/1997

(Continued)

OTHER PUBLICATIONS

English language abstract of European Publication No. EP 0 930 709.
English language abstract of European Publication No. DE 197 03 986 (in the form of U.S. Patent No. 5,883,534, issued on Mar. 16, '99).

(Continued)

Primary Examiner—Tesfaldet Bocure
(74) Attorney, Agent, or Firm—Marger Johnson & McCollom, P.C.

(57) ABSTRACT

A delay locked loop (DLL) circuit having a duty cycle corrector (DCC) that has a broad range of duty cycle correction, consumes only a small amount of power, has few restrictions on operating frequency, and improves the characteristics of a memory device is described. The delay locked loop circuit includes an additional loop for duty cycle correction as well as loops for controlling a rising edge and a falling edge of output signals. Thus, the delay locked loop circuit can internally correct the duty cycle without the use of a phase blender.

18 Claims, 9 Drawing Sheets

FOREIGN PATENT DOCUMENTS

| | | |
|---|---|---|
| EP | 0 930 709 | 7/1999 |
| JP | 1081523 | 3/1998 |
| KR | 2001-95537 | 11/2001 |

OTHER PUBLICATIONS

English language abstract of Korea Publication No. 2001-95537.
English translation of abstract for Japanese Patent No. JP1081523.

* cited by examiner

DELAY LOCKED LOOP CIRCUIT FOR INTERNALLY CORRECTING DUTY CYCLE AND DUTY CYCLE CORRECTION METHOD THEREOF

BACKGROUND OF THE INVENTION

This application claims the priority of Korean Patent Application No. 2002-60814, filed 5 Oct. 2002, in the Korean Intellectual Property Office, the disclosure of which is incorporated herein in its entirety by reference.

1. Field of the Invention

The present invention relates to a delay locked loop (DLL) circuit, and more particularly, to a DLL for internally correcting a duty cycle and a duty cycle correction method thereof.

2. Description of the Related Art

In data transmission such as between a memory device and a memory controller where data is transmitted after the data is synchronized with a clock signal, bus load and transmission frequency have increased. Thus, it is increasingly important to synchronize the data with the clock signal. That is, the time required to load the data onto the bus in response to the clock signal is compensated for to place the data at edges or centers of the clock signal. Between a phase locked loop (PLL) and a delay locked loop (DLL), the DLL is generally used in memory devices.

In a double data rate (DDR) interface where data is output at both a rising edge and a falling edge of the clock signal, the data interval output at the rising edge is different from the data interval output at the falling edge when the duty cycle of the clock signal is not 50%. In this case, timing margin is reduced because the valid data window for the clock transition is defined by a smaller data interval. Thus, a duty cycle corrector (DCC) is needed to correct the duty cycle of the clock signal.

Figure 1:
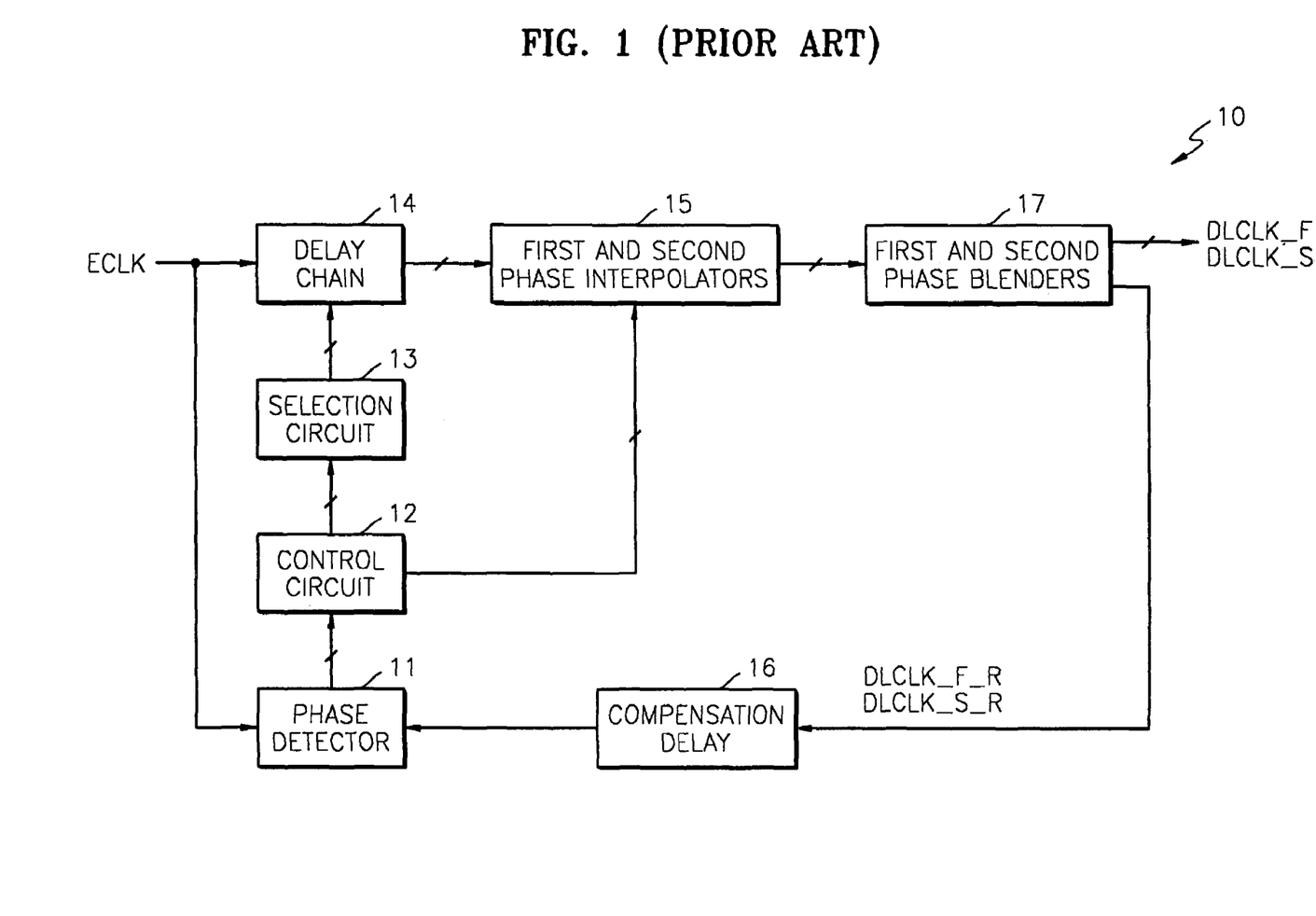
FIG. 1 is a block diagram of a register-controlled delay locked loop (DLL) having a conventional duty cycle corrector (DCC)

FIG. 1 is a block diagram of a register-controlled DLL10 having a conventional DCC.

Referring to FIG. 1, the register controlled DLL10 includes a phase detector 11, a control circuit 12, a selection circuit 13, a delay chain 14, first and second phase interpolators 15, and a compensation delay 16.

DLL10 has a coarse loop and a fine loop. DLL10 uses the delay chain 14, i.e., a delay line, to control a delay for a coarse lock interval and uses the first and second phase interpolators 15 to control a fine delay for a fine lock interval.

In the conventional prior art, first and second phase blenders 17 are connected to an output end of the first and second phase interpolators 15 to generate internal clock signals DLCLK_F and DLCLK_S, whose duty cycles are corrected. The first and second phase blenders 17 each include two inverters 21 and 23, which have a common output end as shown in phase blender 20 of FIG. 2. Thus, a rising edge of an output signal OUT is generated between a rising edge of a signal IN1 input to the inverter 21 and a rising edge of a signal IN2 input to the inverter 23. In the same way, a falling edge of the output signal OUT is generated between a falling edge of the signal IN1 input to the inverter 21 and a falling edge of the signal IN2 input to the inverter 23.

Figure 2:
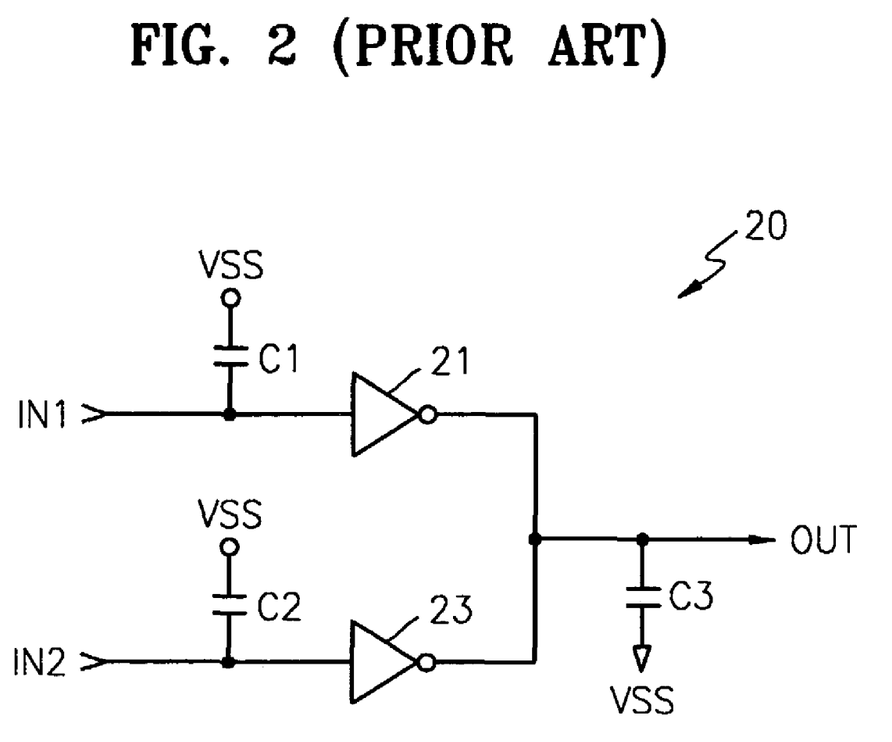
FIG. 2 is a circuit diagram of the phase blenders of FIG. 1.

However, a duty cycle correction method using phase blenders 20 has the following disadvantages. Firstly, the range of the DCC is related to the slopes of the signals IN1 and IN2. That is, the slopes of the signals IN1 and IN2 have to be gentle in order to facilitate the DCC, and thus large capacitance capacitors C1, C2, and C3 are connected to the input ends and the common output end of the inverters 21 and 23. If the duty cycle of an external clock signal ECLK has a ratio of 40 to 60 or a ratio of 60 to 40, the DCC may not perform properly, and power consumption increases, restricting the operating frequency. Secondly, since a delay exists in the phase blenders, a margin of a clock to valid output delay time (tSAC) is reduced.

SUMMARY OF THE INVENTION

The present invention provides a delay locked loop (DLL) circuit having a duty cycle corrector (DCC) that preferably has a broad range of duty cycle correction, consumes only a small amount of power, has few restrictions on operating frequency, and improves memory device characteristics.

The present invention also provides a DLL duty cycle correction method. According to one embodiment of the present invention, a delay locked loop circuit with a duty cycle corrector includes a phase detector, a first control circuit, a second control circuit, a delay line unit, a first phase interpolator, a second phase interpolator, and a third phase interpolator.

The phase detector detects a phase difference between an external clock signal and feedback internal clock signals and generates up-signals and down-signals corresponding to the phase difference. The first control circuit, in response to the up-signals and the down-signals, generates first control signals for coarse locking of the phase difference between the external clock signal and the feedback internal clock signals and generates second control signals for fine locking of the phase difference. The second control circuit, in response to the up-signals and the down-signals, generates third control signals for coarse duty error correction of the external clock signal and generates fourth control signals for fine duty error correction of the external clock signal.

The delay line unit includes a plurality of delay cells connected in series. The delay line unit delays the external clock signal through the delay cells, selects the output signals of first delay cells in response to some of the first control signals, selects the output signals of second delay cells in response to others of the first control signals, and selects the output signals of third delay cells in response to the third control signals.

The first phase interpolator, in response to some of the second control signals, interpolates the output signals of the first delay cells, generates a first output signal and a second output signal, provides the first output signal to the phase detector as one of the feedback internal clock signals, and outputs the second output signal as a first internal clock signal. The second phase interpolator, in response to others of the second control signals, interpolates the output signals of the second delay cells, generates an output signal, and, provides the output signal to the phase detector as another one of the feedback internal clock signals. The third phase interpolator, in response to the fourth control signals, interpolates the output signals of the third delay cells, generates an output signal, and outputs the output signal as a second internal clock signal.

The delay locked loop circuit further comprises a compensation delay that receives the first output signal of the first phase interpolator and the output signal of the second phase interpolator, delays them for a predetermined amount of time, and outputs the delayed first output signal and the delayed output signal to the phase detector.

The second control circuit comprises a first duty correction control circuit that, in response to the up-signals and the down-signals, generates an up-signal and a down-signal for duty correction; and a second duty correction control circuit that, in response to the up-signal and the down-signal for duty correction, generates the third control signals and the fourth control signals.

The up-signal for duty correction is activated when both the up-signal that relates to the rising edge and the up-signal that relates to the falling edge are activated. The down-signal for duty correction is activated when both the down-signal that relates to the rising edge and the down-signal that relates to the falling edge are activated.

The third delay cells are in the center between the first delay cells and the second delay cells.

After locking, the rising edge of the first output signal of the first phase interpolator is finely synchronized with the rising edge of the external clock signal. The second output signal of the first phase interpolator has a pulse that is generated in response to the rising edge of the first output signal of the first phase interpolator after locking. After locking, the rising edge of the output signal of the second phase interpolator is finely synchronized with the falling edge of the external clock signal. The output signal of the third phase interpolator has a pulse that is generated in response to the falling edge of the signal whose duty is corrected after locking.

According to another aspect of the present invention, there is provided in an embodiment a method of correcting a delay locked loop circuit duty cycle having a delay line unit that includes a plurality of delay cells connected in series, the method comprising steps (a) through (g).

In step (a), a phase difference between an external clock signal and feedback internal clock signals is detected, and up-signals and down-signals are generated corresponding to the phase difference. In step (b), in response to the up-signals and the down-signals, first control signals are generated for coarse locking of the phase difference between the external clock signal and the feedback internal clock signals, and second control signals are generated for fine locking of the phase difference. In step (c), in response to the up-signals and the down-signals, third control signals are generated for coarse duty error correction of the external clock signal, and fourth control signals are generated for fine duty error correction of the external clock signal.

In step (d), output signals of the first delay cells are selected in response to the first control signals that relate to the rising edge; output signals of the second delay cells are selected in response to the first control signals that relate to the falling edge; and output signals of the third delay cells in the center between the first delay cells and the second delay cells are selected in response to the third control signals.

In step (e), the output signals of the first delay cells are interpolated in response to the second control signals that relate to the rising edge; a first output signal and a second output signal are generated; the first output signal is provided as one of the feedback internal clock signals; and the second output signal is output as a first internal clock signal. In step (f), the output signals of the second delay cells are interpolated in response to the second control signals that relate to the falling edge; an output signal is generated; and the output signal is provided as another one of the feedback internal clock signals. In step (g), the output signals of the third delay cells are interpolated in response to the fourth control signals; an output signal is generated; and the output signal is output as a second internal clock signal.

Step (c) can further comprise generating an up-signal and a down-signal for duty correction in response to the up-signals and the down-signals and generating the third control signals and the fourth control signals in response to the up-signal and the down-signal for duty correction. The up-signal for duty correction is activated when both the up-signals that relate to the rising edge and the up-signals that relate to the falling edge are activated. The down-signal for duty correction is activated when both the down-signals that relate to the rising edge and the down-signals that relate to the falling edge are activated.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention now will be described more fully with reference to the accompanying drawings, in which preferred embodiments of the invention are shown.

Figure 3:
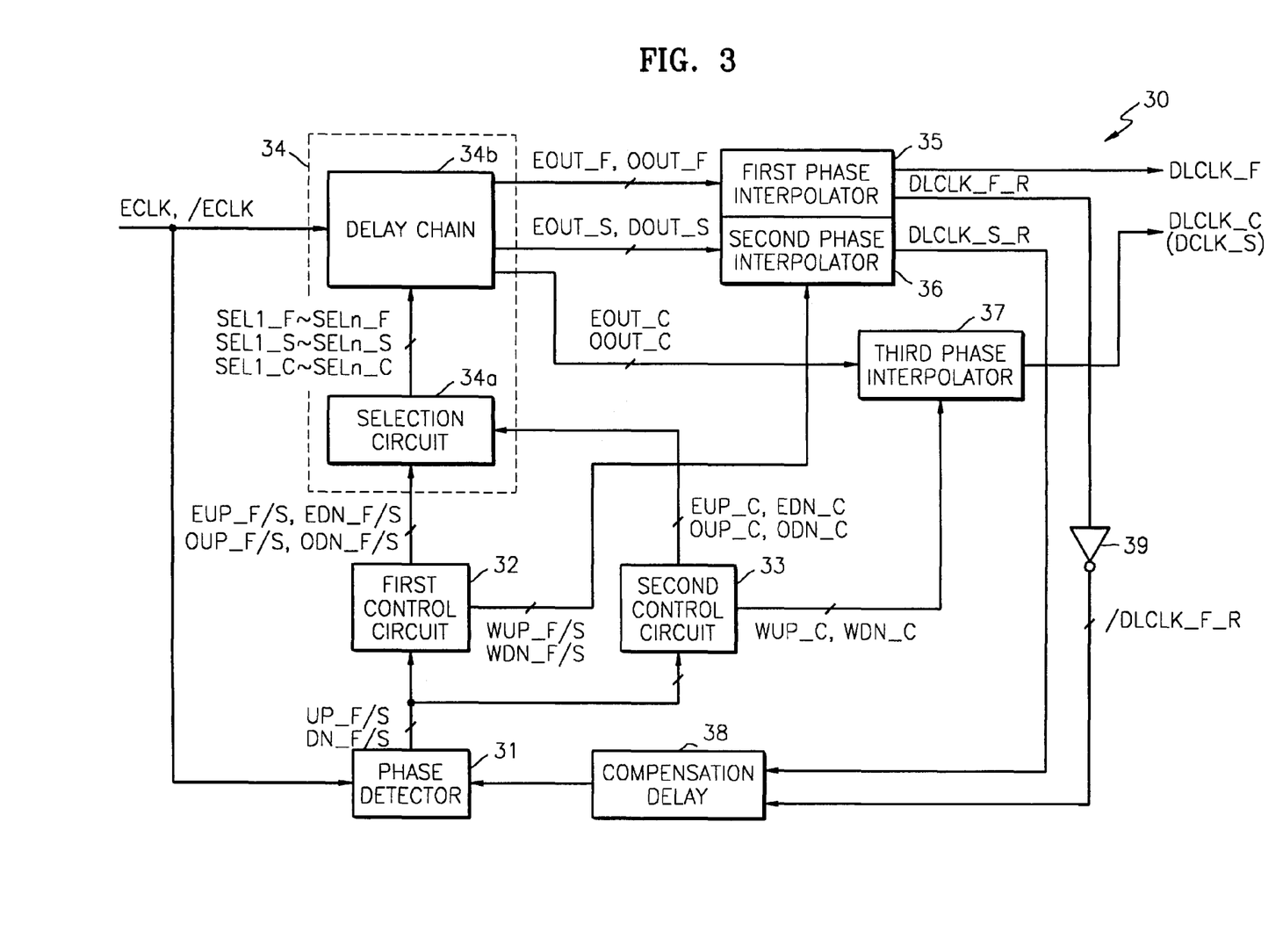
FIG. 3 is a block diagram of a DLL having a duty cycle corrector (DCC) according to embodiment of the present invention.

FIG. 3 is a block diagram of a DLL 30 having a duty cycle corrector (DCC) according to an embodiment of the present invention. Referring to FIG. 3, DLL30 includes a phase detector 31, a first control circuit 32, a second control circuit 33, a delay line unit 34, a first phase interpolator 35, a second phase interpolator 36, a third phase interpolator 37, and a compensation delay 38.

DLL30 is capable of correcting duty cycle. The conventional DLL for a double data rate (DDR) system includes two loops to control a rising edge and a falling edge and includes a phase blender to correct the duty cycle. In contrast, in DLL30, another loop is included, instead of the phase blender, to correct the duty cycle. That is, the second control circuit 33 and the third phase interpolator 37 are added to the conventional DLL of FIG. 1, and the configuration and operation of the delay line unit 34 are different from the delay chain 14 and the selection circuit 13 of the conventional DLL of FIG. 1.

Phase detector 31 detects a phase difference between the external clock signal ECLK and an output signal of compensation delay 38 to generate up-signals UP_F/S and down-signals DN_F/S corresponding to the external clock signal ECLK and the output signal. The compensation delay 38 receives and delays feedback internal clock signals, i.e., an inverted signal /DLCLK_F_R of an output signal DLCLK_F_R of the first phase interpolator 35 and an output signal DLCLK_S_R of the second interpolator 36, for a predetermined amount of time. The predetermined amount of time denotes a delay in the data path of a semiconductor memory device, i.e., a time required to output output data through the data path to an output pad in response to the external clock signal ECLK.

The compensation delay 38 does not need to be included in the DLL. In such a case, the feedback internal clock signals /DLCLK_F_R and DLCLK_S_R are input directly to the phase detector 31.

The first control circuit 32 generates first control signals EUP_F/S, EDN_F/S, OUP_F/S, and ODN_F/S to coarse lock a phase difference between the external clock signal ECLK and the feedback internal clock signals /DLCLK_F_R and DLCLK_S_R, and generates second control signals WUP_F/S and WDN_F/S to fine lock the phase difference between the external clock signal ECLK and the feedback internal clock signals /DLCLK_F_R and DLCLK_S_R, in response to the up-signals UP_F/S and the down-signals DN_F/S.

The second control circuit 33 generates third control signals EUP_C, EDN_C, OUP_C, and ODN_C to correct a coarse duty error of the external clock signal ECLK and generates fourth control signals WUP_C and WDN_C to correct a fine duty error of the external clock signal ECLK, in response to the up-signals UP_F/S and the down-signals DN_F/S. The configurations and operations of the first control circuit 32 and the second control circuit 33 will be described in detail afterwards.

The signals followed by "F" relate to a rising edge of the clock signal, and the signals followed by "S" relate to a falling edge of the clock signal. The signals followed by "C" relate to a duty of the clock signal.

The first control signals EUP_F/S, EDN_F/S, OUP_F/S, and ODN_F/S and the third control signals EUP_C, EDN_C, OUP_C, and ODN_C are used to control delays in the coarse lock interval and are input to the delay line unit 34. The second control signals WUP_F/S and WDN_F/S and the fourth control signals WUP_C and WDN_C are used to control fine delays in the fine lock interval. The second signals WUP_F/S and WDN_F/S are input to the first phase interpolator 35 and the second phase interpolator 36, and the fourth control signals WUP_C and WDN_C are input to the third phase interpolator 37.

The delay line unit 34 includes a selection circuit 34a and a delay chain 34b. The delay chain 34b includes a plurality of delay cells connected in series, and delays the external clock signal ECLK through the delay cells.

More specifically, the delay line unit 34 selects and outputs output signals EOUT_F and OOUT_F of two first delay cells adjacent to each other in the delay chain 34b, e.g., 21st and 22nd delay cells, in response to the control signals EUP_F, EDN_F, OUP_F, and ODN_F that relate to the rising edge among the first control signals EUP_F/S, EDN_F/S, OUP_F/S, and ODN_F/S. In addition, the delay line unit 34 selects and outputs output signals EOUT_S and OOUT_S of two second delay cells adjacent to each other in the delay chain 34b, e.g., 15th and 16th delay cells, in response to the control signals EUP_S, EDN_S, OUP_S, and ODN_S that relate to the falling edge among the first control signals EUP_F/S, EDN_F/S, OUP_F/S, and ODN_F/S. Further, the delay line unit 34 selects and outputs output signals EOUT_C and OOUT_C of two third delay cells adjacent to each other in the center between the first delay cells and the second delay cells, e.g., 18th and 19th delay cells, in response to the third control signals EUP_C, EDN_C, OUP_C, and ODN_C. Thus, the delay line unit 34 controls the delay in the coarse lock interval.

The selection circuit 34a: generates selection signals SEL1_F through SELn_F in response to the control signals EUP_F, EDN_F, OUP_F, and ODN_F that relate to the rising edge among the first control signals EUP_F/S, EDN_F/S, OUP_F/S, and ODN_F/S; generates selection signals SEL1_S through SELn_S in response to the control signals EUP_S, EDN_S, OUP_S, and ODN_S that relate to the falling edge among the first control signals EUP_F/S, EDN_F/S, OUP_F/S, and ODN_F/S; and generates selection signals SEL1_C through SELn_C in response to the third control signals EUP_C, EDN_C, OUP_C, and ODN_C.

The selection signals SEL1_F through SELn_F are signals for selecting output signals EOUT_F and OOUT_F of two first delay cells in the delay chain 34b in order to reduce the phase difference between the rising edge of the external clock signal ECLK and the rising edge of the feedback internal clock signal /DLCLK_F_R. The selection signals SEL1_S through SELn_S are signals for selecting output signals EOUT_S and OOUT_S of two second delay cells in the delay chain 34b in order to reduce the phase difference between the falling edge of the external clock signal ECLK and the falling edge of the feedback internal clock signal DLCLK_S_R. The selection signals SEL1_C through SELn_C are signals for selecting output signals EOUT_C and OOUT_C of two third delay cells in the delay chain 34b in order to adjust the duty cycle to 50%.

In order to control a fine delay that relates to a phase in the fine lock interval, the output signals EOUT_F and OOUT_F of the first delay cells are input to the first phase interpolator 35, and the output signals EOUT_S and OOUT_S of the second delay cells are input to the second phase interpolator 36. In order to control a fine delay that relates to a duty in the fine lock interval, the output signals EOUT_C and OOUT_C of the third delay cells are input to the third phase interpolator 37.

The first phase interpolator 35 interpolates the output signals EOUT_F and OOUT_F of the first delay cells in response to weight information signals, i.e., the second control signals WUP_F and WDN_F input from the first control circuit 32, and generates a first output signal DLCLK_F_R and a second output signal DLCLK_F. The first output signal DLCLK_F_R is provided as one of the feedback internal clock signals to the compensation delay 38 via an inverter 39, and the second output signal DLCLK_F is used as one of the internal clock signals of the memory device.

The second phase interpolator 36 interpolates the output signals EOUT_S and OOUT_S of the second delay cells in response to weight information signals, i.e., the second control signals WUP_S and WDN_S input from the first control circuit 32, and generates an output signal DLCLK_S_R. The output signal DLCLK_S_R is provided as another one of the feedback internal clock signals to the compensation delay 38.

The third phase interpolator 37 interpolates the output signals EOUT_C and OOUT_C of the third delay cells and generates the output signal DLCLK_C in response to weight information signals, i.e., the fourth control signals WUP_C and WDN_C input from the second control circuit 33. The output signal DLCLK_C is used as another one of the internal clock signals of the memory device.

Figure 9A:
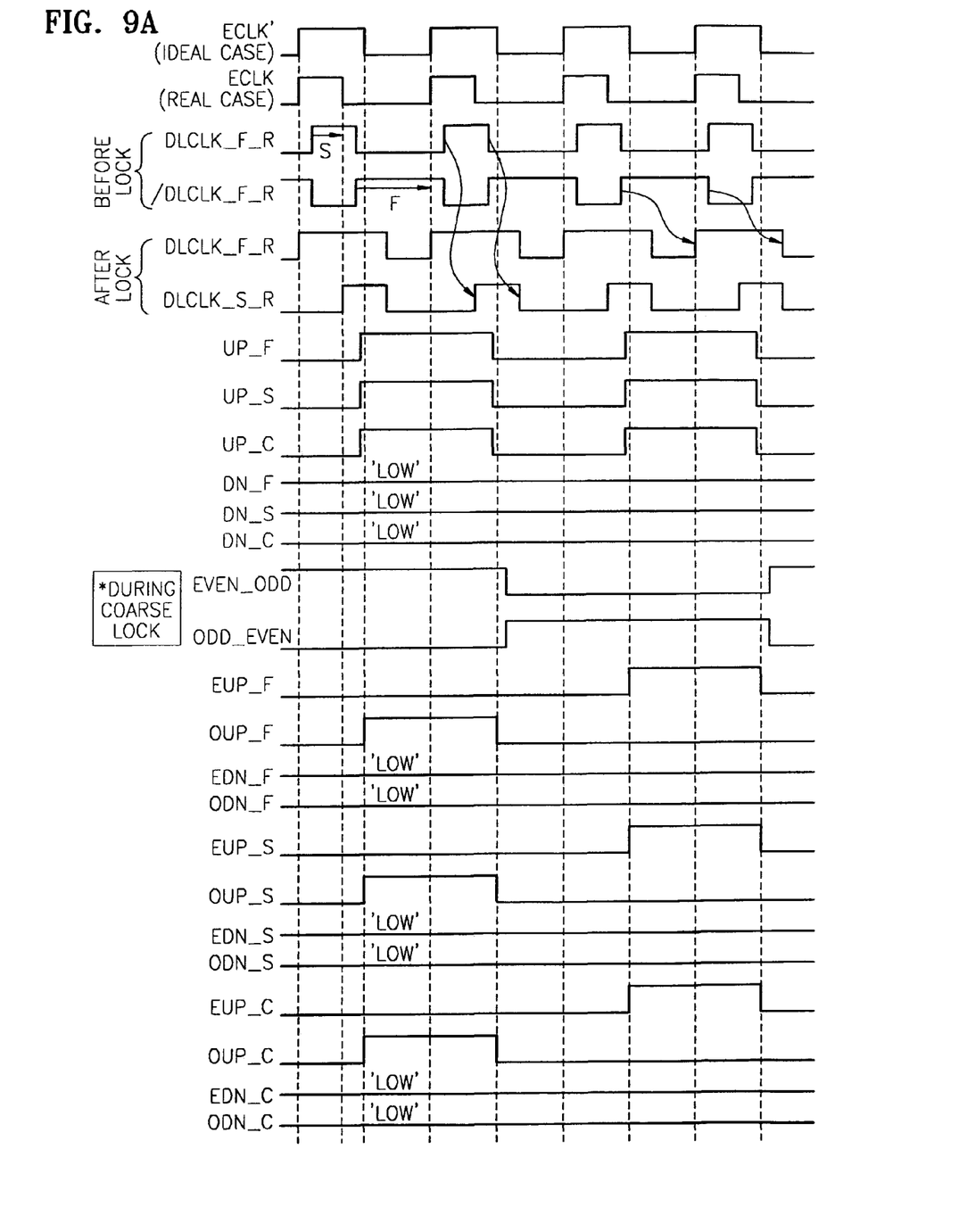
FIGS. 9A and 9B are timing diagrams illustrating operations of a DLL having the DCC shown in FIG. 3, according to an embodiment of the present invention.
Figure 9B:
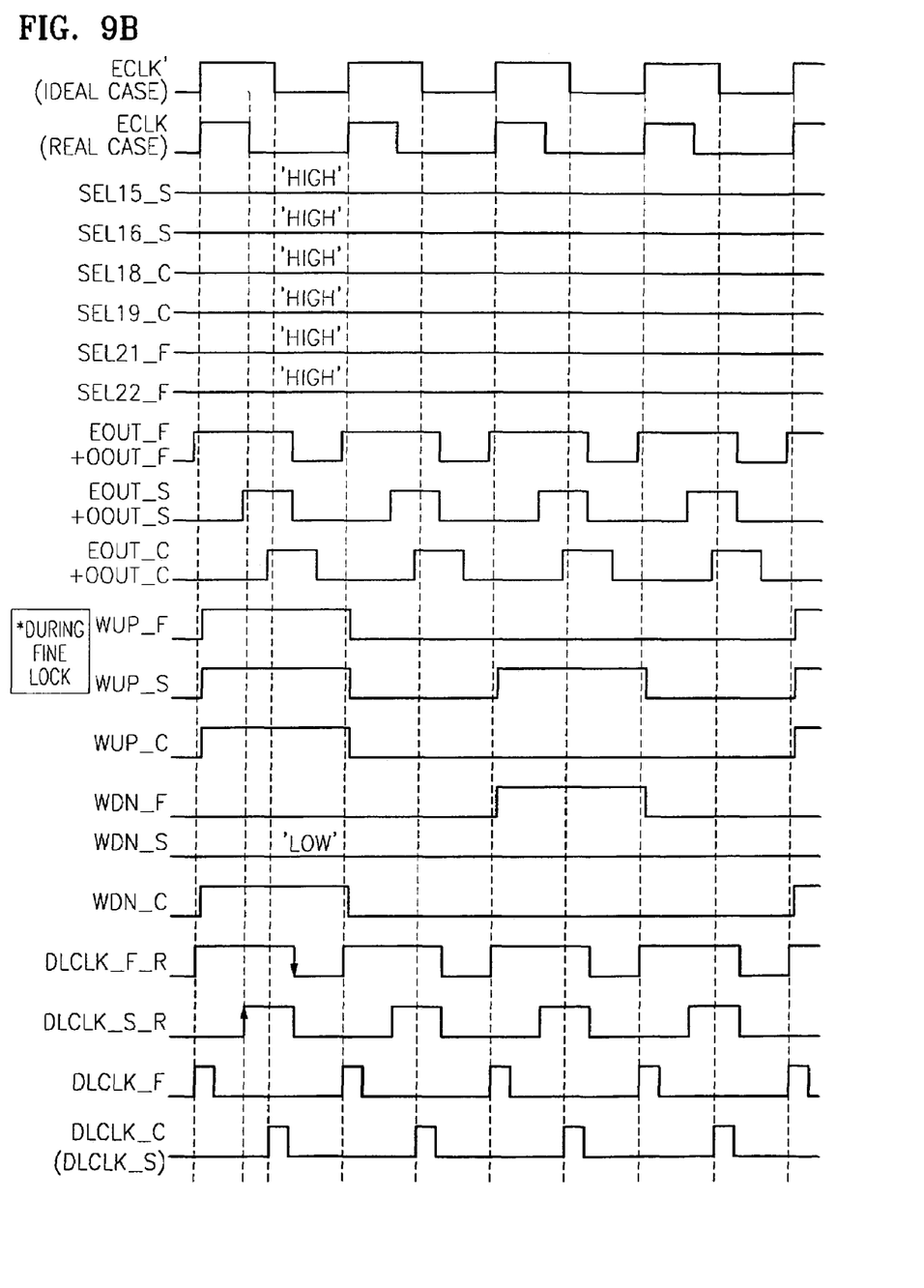

As shown in timing diagrams of FIGS. 9A and 9B, the rising edge of the first output signal DLCLK_F_R of the first phase interpolator 35 is finely synchronized with the rising edge of the external clock signal after locking. The second output signal DLCLK_F of the first phase interpolator 35 has a pulse generated in response to the rising edge of the first output signal DLCLK_F_R after locking. The rising edge of the output signal DLCLK_S_R of the second phase interpolator 36 is finely synchronized with the falling edge of the external clock signal ECLK after locking. The output signal DLCLK_C of the third phase interpolator 37 has a pulse generated in response to the falling edge of the signal whose duty is adjusted to 50% after locking.

Figure 4:
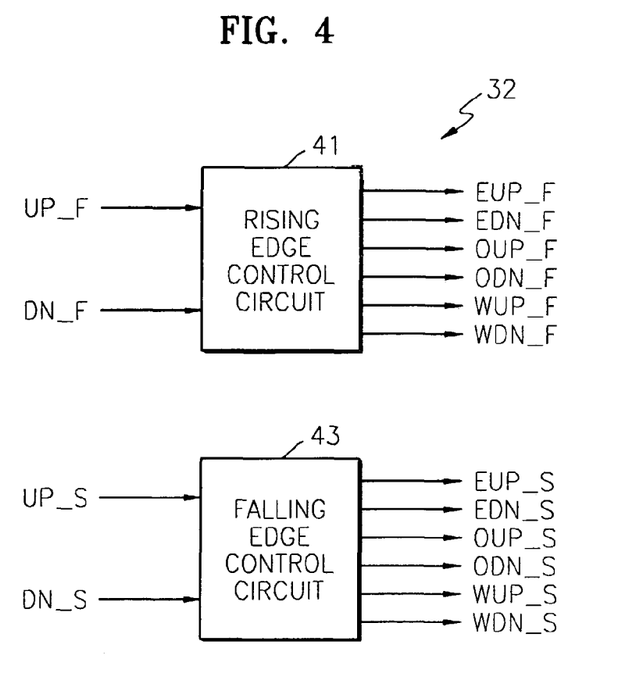
FIG. 4 is a detailed block diagram of a first control circuit of FIG. 3.

FIG. 4 is a detailed block diagram of the first control circuit 32 of FIG. 3. Referring to FIG. 4, the first control circuit 32 includes a rising edge control circuit 41 and a falling edge control circuit 43.

The rising edge control circuit 41 generates the control signals EUP_F, EDN_F, OUP_F, and ODN_F that relate to the rising edge among the first control signals, and generates the control signals WUP_F and WDN_F that relate to the rising edge among the second control signals, in response to the up-signal UP_F and the down-signal DN_F that relate to the rising edge. The falling edge control circuit 43 generates the control signals EUP_S, EDN_S, OUP_S, and ODN_S that relate to the falling edge among the first control signals, and generates the control signals WUP_S and WDN_S that relate to the falling edge among the second control signals, in response to the up-signal UP_S and the down-signal DN_S that relate to the falling edge.

Operation of the rising edge control circuit 41 and the falling edge control circuit 43 will be described later with reference to the timing diagrams of FIGS. 9A and 9B.

Figure 5:
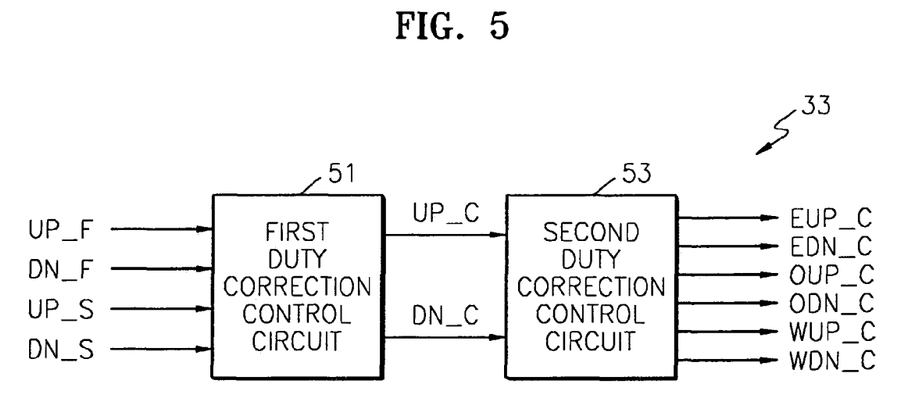
FIG. 5 is a detailed block diagram of a second control circuit of FIG. 3.

FIG. 5 is a detailed block diagram of the second control circuit 33 of FIG. 3. Referring to FIG. 5, the second control circuit 33 includes a first duty correction control circuit 51 and a second duty correction control circuit 53.

The first duty correction control circuit 51 generates an up-signal UP_C and a down-signal DN_C for duty correction in response to the up-signals UP_F and UP_S and the down-signals DN_F and DN_S. The second duty correction control circuit 53 generates the third control signals EUP_C, EDN_C, OUP_C, and ODN_C and the fourth control signals WUP_C and WDN_C in response to the up-signal UP_C and the down-signal DN_C for duty correction.

In particular, the first duty correction control circuit 51 activates the up-signal UP_C for duty correction when both the up-signal UP_F that relates to the rising edge and the up-signal UP_S that relates to the falling edge are activated, so that the output signals EOUT_C and OOUT_C of the third delay cells in the center between the first delays and the second delay cells in the delay line unit 34 can be selected. In addition, the first duty correction control circuit 51 activates the down-signal DN_C for the duty correction when both the down-signal DN_F that relates to the rising edge and the down-signal DN_S that relates to the falling edge are activated.

Figure 6:
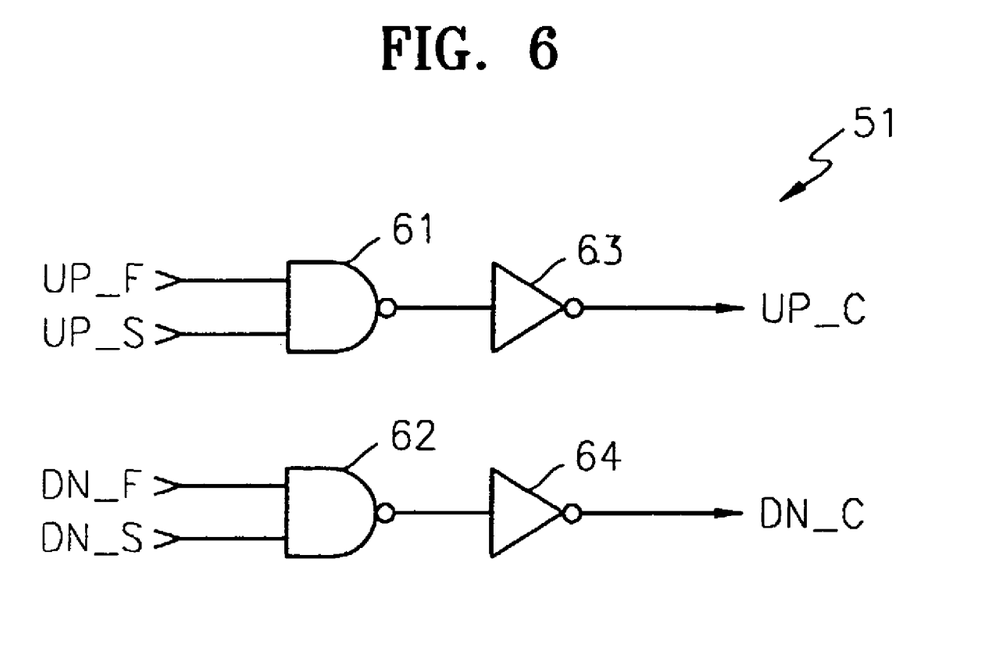
FIG. 6 is a detailed circuit diagram of a first duty correction control circuit of FIG. 5.
Figure 7:
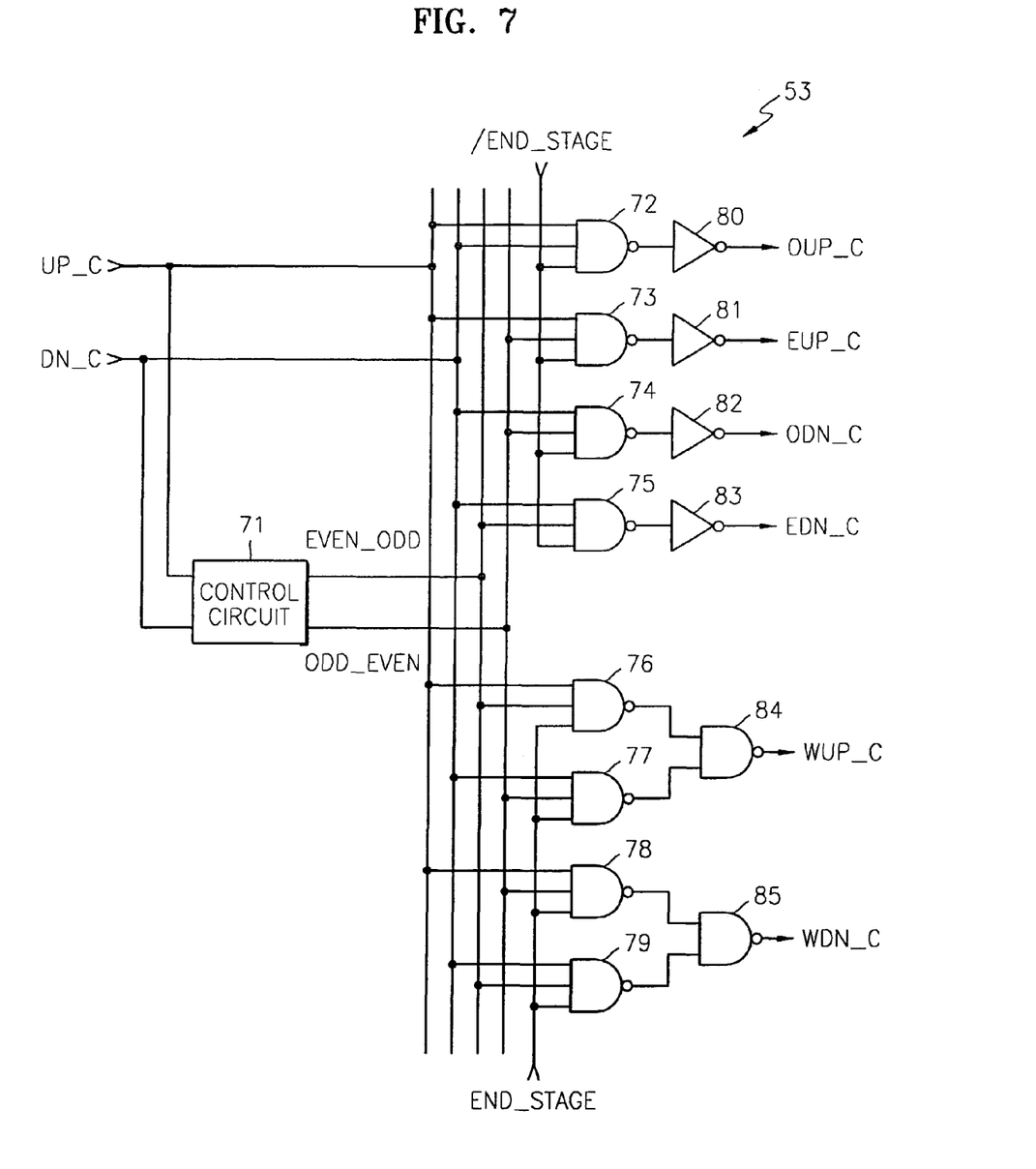
FIG. 7 is a detailed circuit diagram of a second duty correction control circuit of FIG. 5.

FIG. 6 is a detailed circuit diagram of the first duty correction control circuit 51 of FIG. 5, and FIG. 7 is a detailed circuit diagram of the second duty correction control circuit 53 of FIG. 5.

Referring to FIG. 6, the first duty correction control circuit 51 includes NAND gates 61 and 62 and inverters 63 and 64. Referring to FIG. 7, the second duty correction control circuit 53 includes a control circuit 71, NAND gates 72 through 79 and 84 through 85, and inverters 80 through 83. The operation of the first duty correction control circuit 51 and the second duty correction control circuit 53 will be described later with reference to the timing diagrams of FIG. 9.

Figure 8:
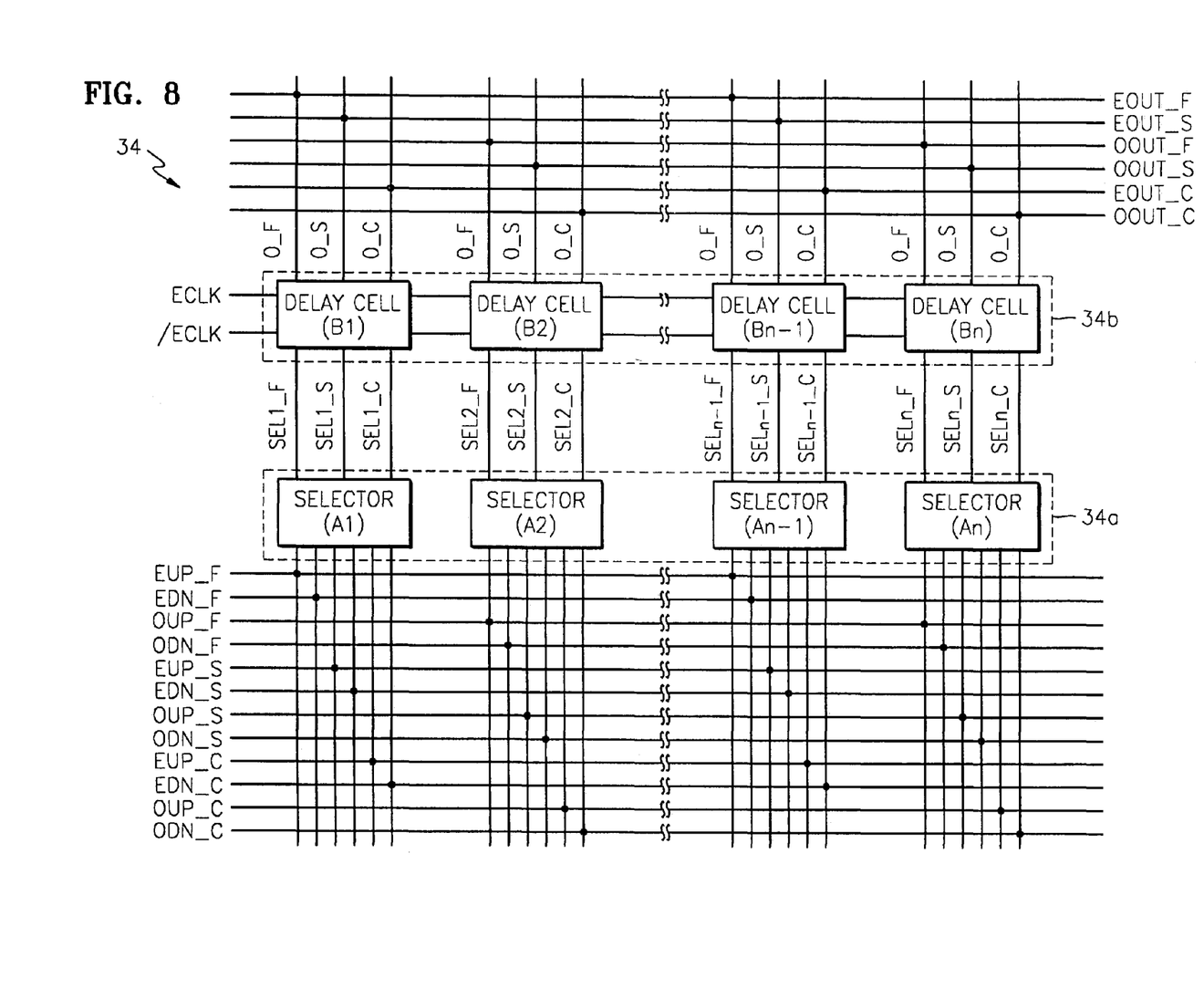
FIG. 8 is a detailed block diagram of a delay line unit of FIG. 3.

FIG. 8 is a detailed block diagram of the delay line unit 34 of FIG. 3.

Referring to FIG. 8, the delay line unit 34 includes the selection circuit 34a and the delay chain 34b. The delay chain 34b includes a plurality of delay cells B1 through Bn, which are connected in series, and delays the external clock signal ECLK through the delay cells.

The selection circuit 34a includes a plurality of selectors A1 through An. As described above, the selection circuit 34a generates selection signals SEL1_F through SELn_F in response to the control signals EUP_F, EDN_F, OUP_F, and ODN_F that relate to the rising edge among the first control signals; generates selection signals SEL1_S through SELn_S in response to the control signals EUP_S, EDN_S, OUP_S, and ODN_S that relate to the falling edge among the first control signals; and generates selection signals SEL1_C through SELn_C in response to the third control signals EUP_C, EDN_C, OUP_C, and ODN_C.

The selection signals SEL1_F through SELn_F are used to select the output signals EOUT_F and OOUT_F of two first delay cells adjacent to each other in the delay chain 34b and are activated in pairs. The selection signals SEL1_S through SELn_S are used to select the output signals EOUT_S and OOUT_S of two second delay cells adjacent to each other in the delay chain 34b and are activated in pairs. The selection signals SEL1_C through SELn_C are used to select the output signals EOUT_C and OOUT_C of two third delay cells adjacent each other in the delay chain 34b and are activated in pairs.

Therefore, two selection signals SEL21_F and SEL22_F of two first delay cells adjacent to each other, e.g., 21st and 22nd delay cells B21 and B22, are activated in response to the control signals EUP_F, EDN_F, OUP_F, and ODN_F that relate to the rising edge among the first control signals, and thus the output signals EOUT_F and OOUT_F of the delay cells B21 and B22 are selected and output. In addition, two selection signals SEL15_S and SEL16_S of two second delay cells adjacent to each other, e.g., 15th and 16th delay cells B15 and B16, are activated in response to the control signals EUP_S, EDN_S, OUP_S, and ODN_S that relate to the falling edge among the first control signals, and thus the output signals EOUT_S and OOUT_S of the delay cells B15 and B16 are selected and output. Also, two selection signals SEL18_C and SEL19_C of two third delay cells adjacent to each other in the center between the first delay cells and the second delay cells, e.g., 18th and 19th delay cells B18 and B19, are activated in response to the third control signals EUP_C, EDN_C, OUP_C, and ODN_C, and thus the output signals EOUT_C and OOUT_C of the delay cells B18 and B19 are selected and output.

FIGS. 9A and 9B are timing diagrams of operations of the DLL having a DCC according to an embodiment of the present invention. Referring now to FIGS. 9A and 9B, operation and the duty cycle correction method of the DLL are described in more detail.

If the external clock signal ECLK having a duty cycle other than 50% is input to the DLL, the feedback internal block signals, i.e., the inverted signal /DLCLK_F_R of the output signal DLCLK_F_R of the first phase interpolator 35 and the output signal DLCLK_S_R of the second phase interpolator 36, are input to the compensation delay 38 and are delayed for a determined amount of time. Then, a phase difference between the external clock signal ECLK and the output signal of the compensation delay 38 is detected by the phase detector 31, and the up-signals UP_F and UP_S and the down-signals DN_F and DN_S are generated.

The first control signals EUP_F, OUP_F, ODN_F, EUP_S, OUP_S, EDN_S, and ODN_S, used to coarse lock a phase difference between the external clock signal ECLK and the feedback internal clock signals /DLCLK_F_R and DLCLK_S_R, and the second control signals WUP_F, WDN_F, WUP_S, and WDN_S, used to fine lock the phase difference are generated in the first control circuit 32 in response to the up-signals UP_F and UP_S and the down-signals DN_F and DN_S.

As shown in the timing diagrams of FIGS. 9A and 9B, the signals EUP_F and OUP_F are generated corresponding to an even-numbered cycle and an odd-numbered cycle, respectively, of the signal UP_F. The signals EDN_F and ODN_F are generated corresponding to an even-numbered cycle and an odd-numbered cycle, respectively, of the signal UP_S. The signals EDN_S and ODN_S are generated corresponding to an even-numbered cycle and an odd-numbered cycle, respectively, of the signal DN_S.

An up-signal UP_C for duty correction and a down-signal DN_C for duty correction are generated in the second control circuit 33 in response to the up-signals UP_F and UP_S and the down-signals DN_F and DN_S. The up-signal UP_C for duty correction is activated to logic "high" when both the up-signal UP_F that relates to the rising edge and the up-signal UP_S that relates to the falling edge are activated to logic "high". In the same way, the down-signal DN_C for the duty correction is activated to logic "high" when both the down-signal DN_F that relates to the rising edge and the down-signal DN_S that relates to the falling edge are activated to logic "high". In the timing diagram of FIG. 9, the up-signal UP_F that relates to the rising edge and the up-signal UP_S that relates to the falling edge are activated, and the down-signal DN_F that relates to the rising edge and the down-signal DN_S that relates to the falling edge are not activated.

Next, the third control signals EUP_C, EDN_C, OUP_C, and ODN_C for a coarse duty error correction of the external clock signal ECLK and the fourth control signals WUP_C and WDN_C for a fine duty error correction are generated in the second control circuit 33 in response to the up-signal UP_C and the down-signal DN_C for the duty correction.

The signals EUP_C and OUP_C are generated corresponding to even-numbered and odd-numbered cycles of the signal UP_C, respectively. The signals EDN_C and ODN_C are generated corresponding to an even-numbered cycle and an odd-numbered cycle, respectively, of the signal DN_C.

Next, in the delay line unit 34, two selection signals SEL21_F and SEL22_F of two first delay cells adjacent to each other, e.g., the 21st and the 22nd delay cells, are activated to logic "high" in response to the control signals EUP_F, EDN_F, OUP_F, and ODN_F that relate to the rising edge among the first control signals EUP_F, OUP_F, ODN_F, EUP_S, OUP_S, EDN_S, and ODN_S. Thus, the output signals of the 21st and the 22nd delay cells are selected and output as output signals EOUT_F and OOUT_F.

Also, in the delay line unit 34, two selection signals SEL15_S and SEL16_S of two second delay cells adjacent to each other, e.g., the 15th and the 16th delay cells, are activated to logic "high" in response to the control signals EUP_S, EDN_S, OUP_S, and ODN_S that relate to the falling edge among the first control signals EUP_F, OUP_F, ODN_F, EUP_S, OUP_S, EDN_S, and ODN_S. Thus, the output signals of the 15th and the 16th delay cells are selected and output as output signals EOUT_S and OOUT_S.

In the delay line unit 34, two selection signals SEL18_C and SEL19_C of two third delay cells in the center between the first delay cells and the second delay cells, e.g., the 18th and the 19th delay cells, are activated to logic "high" in response to the third control signals EUP_C, EDN_C, OUP_C, and ODN_C. Thus, the output signals of the 18th and the 19th delay cells are selected and output as output signals EOUT_C and OOUT_C. Consequently, the output signals EOUT_F and OOUT_F, the output signals EOUT_S and OOUT_S, and the output signals EOUT_C and OOUT_C are coarse locked with respect to the external clock signal ECLK.

After that, in the first phase interpolator 35, the output signals EOUT_F and OOUT_F are interpolated in response to the second control signals WUP_F and WDN_F, and the signal DLCLK_F_R, whose rising edge is synchronized with the rising edge of the external clock signal, is generated. Also, the first internal clock signal DLCLK_F, which has a pulse generated in response to the rising edge of DLCLK_F_R, is generated. The signal DLCLK_F_R is inverted and provided to compensation delay 38 as one of the feedback internal clock signals, and the first internal clock signal DLCLK_F is used as one of the internal clock signals in the memory device.

In the second phase interpolator 36, the output signals EOUT_S and OOUT_S are interpolated in response to the second control signals WUP_S and WDN_S, and the signal DLCLK_S_R, whose rising edge is finely synchronized with the falling edge of the external clock signal ECLK, is generated. The signal DLCLK_S_R is provided to the compensation delay 38 as another one of the feedback internal clock signals.

In the third phase interpolator 37, the output signals EOUT_C and OOUT_C are interpolated in response to the fourth control signals WUP_C and WDN_C, and the second internal clock signal DLCLK_C, whose rising edge is enabled in the center between the rising edge of the signal DLCLK_S_R and the falling edge of the signal DLCLK_F_R, is generated. As a result, the rising edge of the second internal clock signal DLCLK_C is synchronized with the falling edge of an ideal external clock signal ECLK' having a duty cycle of 50%. The second internal clock signal DLCLK_C is used as another one of the internal clock signals in the memory device.

As described above, in a DLL according to this embodiment, even though the external clock signal ECLK having a duty cycle other than 50% is input, the duty cycle is corrected to 50% by generating the first internal clock signal DLCLK_F whose rising edge is synchronized with the rising edge of the external clock signal ECLK and generating the second internal clock signal DLCLK_C whose rising edge is synchronized with the falling edge of the ideal external clock signal ECLK'.

If the ideal external clock signal ECLK' having a duty cycle of 50% is input, two delay cells adjacent to each other are selected in the delay line unit 34, and the output signals EOUT_F and OOUT_F, the output signals EOUT_S and OOUT_S, and the output signals EOUT_C and OOUT_C are output from the selected delay cells. As a result, the rising edge of the signal DLCLK_F_R that is fed back is synchronized with the rising edge of the ideal external clock signal ECLK', and the rising edge of the signal DLCLK_S_R that is fed back is synchronized with the falling edge of the ideal external clock signal ECLK'.

Consequently, the rising edge of the first internal clock signal DLCLK_F is synchronized with the rising edge of the ideal external clock signal ECLK', and the rising edge of the second internal clock signal DLCLK_S is synchronized with the falling edge of the ideal external clock signal ECLK'.

As described above, DLL according to the present invention can internally correct the duty cycle without the use of a phase blender. Since the phase blender is not included, the DLL can have a broad range of duty cycle correction, can consume only a small amount of power, can have few restrictions on operating frequency, and can improve the characteristics of a memory device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A delay locked loop circuit having a duty cycle corrector, the delay locked loop circuit comprising:
    a phase detector that detects a phase difference between an external clock signal and feedback internal clock signals and generates up-signals and down-signals corresponding to the phase difference;
    a first control circuit that, in response to the up-signals and the down-signals, generates first control signals for coarse locking of the phase difference between the external clock signal and the feedback internal clock signals and generates second control signals for fine locking of the phase difference;
    a second control circuit that, in response to the up-signals and the down-signals, generates third control signals for coarse duty error correction of the external clock signal and generates fourth control signals for fine duty error correction of the external clock signal; and
    a delay line unit that includes a plurality of delay cells connected in series, delays the external clock signal through the delay cells, selects output signals of first delay cells from the plurality of delay cells in response to some of the first control signals, selects output signals of second delay cells from the plurality of delay cells in response to others of the first control signals, and selects output signals of third delay cells from the plurality of delay cells in response to the third control signals.

2. The delay locked loop circuit of claim 1, wherein some of the first control signals relate to a rising edge of the external clock signal, and the remaining signals of the first control signals relate to a falling edge of the external clock signal.

3. The delay locked loop circuit of claim 2, wherein some of the second control signals relate to a rising edge of the external clock signal, and the remaining signals of the second control signals relate to a falling edge of the external clock signal.

4. The delay locked loop circuit of claim 3, wherein the first control circuit comprises:
    a rising edge control circuit that, in response to an up-signal and a down-signal that relate to the rising edge, generates control signals that relate to the rising edge among the first control signals and generates control signals that relate to the rising edge among the second control signals; and
    a falling edge control circuit that, in response to an up-signal and a down-signal that relate to the falling edge, generates control signals that relate to the falling edge among the first control signals and generates control signals that relate to the falling edge among the second control signals.

5. The delay locked loop circuit of claim 3, wherein the second control circuit comprises:
    a first duty correction control circuit that, in response to the up-signals and the down-signals, generates an up-signal and a down-signal for duty correction; and,
    a second duty correction control circuit that, in response to the up-signal and the down-signal for duty correction, generates the third control signals and the fourth control signals.

6. The delay locked loop circuit of claim 5, wherein the up-signal for duty correction is activated when both the up-signal that relates to the rising edge and the up-signal that relates to the falling edge are activated.

7. The delay locked loop circuit of claim 5, wherein the down-signal for duty correction is activated when both the down-signal that relates to the rising edge and the down-signal that relates to the falling edge are activated.

8. The delay locked loop circuit of claim 1, wherein the third delay cells are selected in the center between the first delay cells and the second delay cells.

9. The delay locked loop circuit of claim 1, further comprising:
    a first phase interpolator that, in response to some of the second control signals, interpolates the output signals of the first delay cells, generates a first output signal and a second output signal, provides the first output signal to the phase detector as one of the feedback internal clock signals, and outputs the second output signal as a first internal clock signal;
    a second phase interpolator that, in response to others of the second control signals, interpolates the output signals of the second delay cells, generates an output signal, and provides the output signal to the phase detector as another one of the feedback internal clock signals; and
    a third phase interpolator that, in response to the fourth control signals, interpolates the output signals of the third delay cells, generates an output signal, and outputs the output signal as a second internal clock signal.

10. The delay locked loop circuit of claim 9 further comprising:
    a compensation delay that receives the first output signal of the first phase interpolator and the output signal of the second phase interpolator, delays them for a predetermined amount of time, and outputs the delayed first output signal of the first phase interpolator and the delayed output signal of the second phase interpolator to the phase detector.

11. The delay locked loop circuit of claim 9, wherein, after locking, the rising edge of the first output signal of the first phase interpolator is finely synchronized with the rising edge of the external clock signal.

12. The delay locked loop circuit of claim 9, wherein the second output signal of the first phase interpolator has a pulse that is generated in response to the rising edge of the first output signal of the first phase interpolator after locking.

13. The delay locked loop circuit of claim 9, wherein, after locking, the rising edge of the output signal of the second phase interpolator is finely synchronized with the falling edge of the external clock signal.

14. The delay locked loop circuit of claim 9, wherein the output signal of the third phase interpolator has a pulse that is generated in response to the falling edge of the signal whose duty is corrected after locking.

15. A method of correcting a clock signal duty cycle in a delay locked loop circuit having a delay line unit that includes a plurality of delay cells connected in series, the method comprising:
- (a) detecting a phase difference between an external clock signal and feedback internal clock signals, and generating up-signals and down-signals corresponding to the phase difference;
- (b) in response to the up-signals and the down-signals, generating first control signals for coarse locking of the phase difference between the external clock signal and the feedback internal clock signals and generating second control signals for fine locking of the phase difference each of the first and second control signals comprising some signals that relate to the rising edge of the external clock signal and some signals that relate to the falling edge of the external clock signal;
- (c) in response to the up-signals and the down-signals, generating third control signals for coarse duty error correction of the external clock signal and fourth control signals for fine duty error correction of the external clock signal;
- (d) selecting output signals of first delay cells from the plurality of delay cells in response to the first control signals that relate to the rising edge, selecting output signals of second delay cells from the plurality of delay cells in response to the first control signals that relate to the falling edge, and selecting output signals of third delay cells from the plurality of delay cells, between the first delay cells and the second delay cells, in response to the third control signals;
- (e) interpolating the output signals of the first delay cells in response to the second control signals that relate to the rising edge to generate a first output signal and a second output signal, and providing the first output signal as one of the feedback internal clock signals and outputting the second output signal as a first internal clock signal;
- (f) interpolating the output signals of the second delay cells in response to the second control signals that relate to the falling edge to generate an output signal, and providing the output signal as another one of the feedback internal clock signals; and
- (g) interpolating the output signals of the third delay cells in response to the fourth control signals to generate an output signal, and outputting the output signal as a second internal clock signal.

16. The method of claim 15, wherein step (c) comprises:
- (c1) generating an up-signal and an down-signal for duty correction in response to the up-signals and the down-signals; and
- (c2) generating the third control signals and the fourth control signals in response to the up-signal and the down-signal for duty correction.

17. The method of claim 16, wherein the up-signal for duty correction is activated when both the up-signals that relate to the rising edge and the up-signals that relate to the falling edge are activated.

18. The method of claim 16, wherein the down-signal for duty correction is activated when both the down-signals that relate to the rising edge and the down-signals that relate to the falling edge are activated.

* * * * *